(12) United States Patent
Matters-Kammerer et al.

(10) Patent No.: US 7,187,250 B2
(45) Date of Patent: Mar. 6, 2007

(54) COUPLER, INTEGRATED ELECTRONIC COMPONENT AND ELECTRONIC DEVICE

(75) Inventors: Marion Kornelia Matters-Kammerer, Limbricht (NL); Theodoor Gertrudis Silvester Maria Rijks, Eindhoven (NL); Marco Matters, Eindhoven (NL)

(73) Assignee: NXP B.V., Eindhoven (NL)

( * ) Notice: Subject to any disclaimer, the term of this patent is extended or adjusted under 35 U.S.C. 154(b) by 55 days.

(21) Appl. No.: 10/498,757

(22) PCT Filed: Dec. 5, 2002

(86) PCT No.: PCT/IB02/05174

§ 371 (c)(1), (2), (4) Date: Feb. 7, 2005

(87) PCT Pub. No.: WO03/055065

PCT Pub. Date: Jul. 3, 2003

(65) Prior Publication Data
US 2005/0116788 A1  Jun. 2, 2005

(30) Foreign Application Priority Data
Dec. 20, 2001  (EP)  ............................... 01205038

(51) Int. Cl.
*H01P 3/08* (2006.01)
*H01P 5/18* (2006.01)

(52) U.S. Cl. .................................. 333/116; 333/112
(58) Field of Classification Search ............... 333/109, 333/110, 112, 116, 24.1
See application file for complete search history.

(56) References Cited

U.S. PATENT DOCUMENTS

| 3,740,675 | A | * | 6/1973 | Moore et al. ............... 333/205 |
| 4,121,182 | A | | 10/1978 | Makimoto |
| 4,543,543 | A | * | 9/1985 | Blight et al. ............... 333/24.1 |
| 5,818,307 | A | | 10/1998 | Ritchie |

FOREIGN PATENT DOCUMENTS

EP  1047151 A1  10/2000

* cited by examiner

Primary Examiner—Dean Takaoka

(57) ABSTRACT

A coupler (10) having a first line (1) and a second line (2) also comprises a resonant structure (3) including a capacitor (5) and an inductor (4). The coupler (10) thus delivers a coupling signal S31 that is substantially frequency independent over a frequency domain above the resonance frequency of the resonant structure (3). Also, the signal S31 has a high degree of directivity. The coupler (10) can be provided as part of an integrated electronic component, such as a multilayer substrate, a thin-film module or an IC. It can be applied in an electronic device (100) between a power amplifier (101) and an antenna (103). The coupling signal S31 will thus be provided to a controlling circuit (102).

11 Claims, 8 Drawing Sheets

COUPLER, INTEGRATED ELECTRONIC COMPONENT AND ELECTRONIC DEVICE

The invention relates to a coupler comprising a first line connecting a signal input to a signal output, and a second line connecting a matched connection to a second output, which first and second line are mutually coupled inductively and capacitively.

The invention also relates to an integrated electronic component for use at frequencies of 100 MHz and higher and fulfilling filtering and/or switching functions and comprising a substrate and a plurality of electrically insulating and electrically conductive layers.

The invention also relates to an electronic device comprising a power amplifier and a power transmitter that are interconnected via a first line of a coupler that is also provided with a second line having a second output to a controlling circuit.

Such a coupler is known from U.S. Pat. No. 5,818,307. FIG. 1 of this document discloses a directional coupler, in which the first line and the second line are present on a printed circuit board, parallel to each other, such that there is coupling. A resistive load is present at the matched connection of the second line and a Schottky diode is present at the second output of the second line. The load impedance is selected to minimize reflections and to increase directivity, and the capacitor is selected to be resonant at the frequency of interest such that a voltage output is provided at the second output.

In order to realize an optimum coupler, the resulting influence of the coupler on the signal output and input and on the matched connection ought to be small and the second output ought to be relatively large. Theoretically this can be described as that the coupler has four effects: a return loss $S11$ at the signal input, an insertion loss $S21$ at the signal output, a coupling $S31$ at the second output and an isolation $S41$ at the matched connection. It will be understood that the insertion loss $S21$ must be very small, preferably less than 0.5 dB, and that the coupling should be large compared to and distinguishable against the isolation $S41$ and the return loss $S11$.

It has been found, however, that the known coupler has a coupling $S31$ that is dependent on the frequency. Consequently, it can be distinguished against the isolation $S41$ and the return loss $S11$ over a relatively small frequency domain only. This implies that the coupling $S31$ is not constant over a frequency-domain that is used as a communication band, such as the bands of Bluetooth, DCS, GSM and UMTS. As a consequence, a compensation for the frequency dependency of the coupling $S31$ is necessary, either in the controlling circuit or at the output of the coupler.

It is, therefore, a first object of the invention to provide a coupler of the kind mentioned in the opening paragraph, wherein the magnitude of the second output (the coupling $S31$) is reasonably independent of the frequency for a frequency interval in use as a band.

This object is realized in that a resonant structure is present and that the first line and the second line are coupled inductively and capacitively to the resonant structure.

Surprisingly it was found that the addition of a resonant structure leads to the desired effect. The coupling $S31$ turns out to be reasonably frequency independent at frequencies in an interval above a resonant frequency of the resonant structure. An advantage was that the coupling $S31$ can be made to be distinguishably larger than the isolation $S41$ and the return loss $S11$ over a very large frequency domain above the resonance frequency. For a resonance frequency of 1.3 GHz the coupling $S31$ was 15 dB larger than the isolation $S41$ and the return loss $S11$ up to frequencies of about 4 GHz. This large difference of the coupling $S31$ over the isolation $S41$ leads to an additional advantage of the coupler of the present invention: no diode is necessary for obtaining the directivity at the second output.

The coupler of the invention appears to be based on the fact that there is a direct coupling and a resonant coupling between the first and the second line. The combination of both coupling mechanisms is exploited to create a coupler that fulfills the object of the invention. Therewith the resonant frequency can be set by variation of the resonant structure. The optimum frequency response of the coupler can be set by variation of the direct coupling and the resonant coupling, for example, by changes in the distances between the lines, in the geometry of the lines or in the dielectric constant of the material in between of the lines. The size of the inductor and the capacitor can also be changed.

It is an advantage of the coupler of the invention that it can be used for various applications without requiring elaborate redesign. Due to the good directivity of the coupler, it is in principle sufficient to change the resonance frequency by changing, for example, the capacity of the capacitor. For moderate frequency changes it may even be that there is no need for modification of the coupler at all.

From EP-A 1047150 a coupler is known in which an inductor and a capacitor have been included in the second line. However, in this way the coupling $S31$ as well as the other signals $S11$, $S21$ and $S41$ are influenced over the complete frequency domain. As is illustrated by FIG. 6 and the exemplary embodiment 3 of this patent application, the coupling $S31$—referred to as C—is not substantially constant over a larger frequency interval. Further on, the directivity is comparatively small, i.e. smaller than 10 dB. Besides, the behavior at the resonant frequency, where the signals $S11$, $S31$ and $S41$ are of comparable magnitude, is completely absent in this known coupler.

The coupler of the invention can be embodied in various ways. It can be implemented with discrete components for the resonant structure. The plane of the turns of the inductor must then be oriented substantially parallel to the first line. Such an embodiment with discrete components is especially advantageous for use at lower frequencies, such as 100 MHz or lower. Since the resonance frequency is inversely proportional to the square root of the product of the capacitance and the inductance, the capacitance and the inductance must be high. This can be realized with ceramic multilayer capacitors and inductors with a plurality of turns.

In an advantageous embodiment the resonant structure comprises a thin-film capacitor and a thin-film inductor, and the first and the second line are coupled inductively and capacitively to the inductor. The implementation of the resonant structure has the advantage that the coupler can be integrated in any multilayer electronic component. Functionally, the coupler can be designed very well to optimize the inductive and capacitive coupling between the first and second line and the resonant structure, since the mutual overlap (and hence the relevant area for capacitively coupling) is defined in the lithographic pattern. Further advantages are that assembly can be minimized and that the individual couplers will all be equal and not dependent on variations in the individual components and placement relative to one another.

Within the thin-film embodiment there are several variants. In one advantageous variant the first line is present in a first electrically conductive layer, the second line is present in a second electrically conductive layer and the inductor of the resonant structure is present in one or more electrically conductive layer that are located between the first and the second electrically conductive layer. It is preferred to provide one of the electrodes of the capacitor in the second electrically conductive layer. In this variant, the resonant structure is sandwiched between the layers of the first and the second line. In order to have sufficient capacitive coupling between the first and the second line, it is preferred that these lines lie in one plane, which is oriented substantially perpendicularly to the plane of the inductor. An advantage of the embodiment is that the amount of coupling between the first line and the resonant structure may differ from the amount of coupling between the resonant structure and the second line. For example, a dielectric layer with a relatively high dielectric constant can be provided between the inductor and the second line so as to maximize coupling. This dielectric layer can also be used for the capacitor. Another advantage is that the second electrically conductive layer can be embodied as a thin layer, such as a layer of gold, aluminum or the like, whereas the layers of the first line and the inductor can be embodied as thick layers containing, for example, copper. This not only has the advantage that the inductor and the second line will have a high Q-factor, but also they are suitable for high frequencies.

In another advantageous variant the inductor of the resonant structure has one turn that is present in a first electrically conductive layer and the first and the second line are present in a second electrically conductive layer. An advantage of this embodiment is that the coupler constitutes as a relatively small unit. Therefore, its integration into integrated electronic components is facilitated. The coupler could be integrated, for example, in a multilayer substrate. It is then advantageous that the first electrically conductive layer is present at the surface of the substrate, whereas the resonant structure is embedded inside the substrate.

In a further elaboration of this embodiment the capacitor comprises a first and second electrode, which first electrode is present in the first electrically conductive layer and which second electrode is present in the second electrically conductive layer, and the first and the second electrically conductive layer are mutually separated through a spacer comprising a dielectric layer and an insulating layer, the insulating layer being absent between the first and second electrode of the capacitor. Herein, an insulating layer is meant to be a layer with a low dielectric constant, e.g. with a dielectric constant equal to or lower than that of $SiO_2$. Preferred examples include layers of materials such as benzocyclobutene, HSQ, MSQ, porous silica and other low K materials. Herein, a dielectric layer is meant to be a layer with a relatively high dielectric constant, e.g. a with a dielectric constant higher than that of $SiO_2$. Preferred examples include $Si_3N_4$, as well as bariumtitanate and tantalumoxide based materials.

This elaboration has the advantage that only two electrically conductive layers are necessary to implement the coupler. These layers may be present on a substrate with a rough surface. Suitable materials for the electrically conductive layers are aluminum, copper, nickel, silver and the like, preferably in a thickness exceeding the penetration depth of the electromagnetic waves at the frequency used. The technology used for this elaboration is known from Th. Rijks et al., *Proceedings IMAPS* 2001, and is described in the non-prepublished patent application bearing number EP01203071.4 (PHNL010579).

Another embodiment of the coupler according to the present invention includes a tunable capacitor. Using such a tunable capacitor, the resonance frequency of the resonant structure can be modified as desired. As explained above, the frequency domain of the coupler will shift with the shift in resonance frequency. The tunable capacitor can be implemented as a Microelectromechanical Component (MEMS). Then, the MEMS capacitor may be present on the substrate, whereas the first and second lines are present inside the substrate. Alternatively, lines and MEMS capacitor and inductor can be present in the interconnect structure of an integrated circuit.

The tuning of the frequency domain of the coupler can be exploited through the addition of a third line which connects a matched connection with to a third output and is coupled inductively and capacitively to the first line and is coupled inductively and capacitively to the resonant structure. The third line allows a second feed back on the signals running via the first line. The design of the coupler may be optimized in order to minimize mutual coupling between the second and the third line. They may be present in the same electrically conductive layer, but on opposite sides of the first line. Alternatively, they may be present in different electrically conductive layers, on opposite sides of the resonant structure, each of them being situated in a plane with the first line.

In this embodiment the coupler of the invention is suitable as a dual-band coupler. Due to the tunability of the frequency of the resonant structure, the third line can give feedback on a frequency other than the second line. Furthermore, it is preferred that the third line provides a feedback to component other than the second line. The coupler of this embodiment can be used as a coupler for two power amplifiers, each dedicated to a specific frequency domain, that are connected to one and the same antenna. Such a design with two power amplifiers and one antenna is envisaged for use in mobile communication with different standards, such as GSM and Bluetooth. It will be understood by those skilled in the art that a connection point is necessary for the connection of two amplifiers and one antenna. This can be realized as a switch, such as a pin-diode or a MEMS-switch, or as a filter, for example a band-pass filter. It is preferred to use a MEMS-switch. A first advantage of this switch is that it can be manufactured and encapsulated together with the MEMS-capacitor. More important advantages are that the MEMS-switch has a low loss and provides excellent isolation. It will also be understood that the connection point can be present on both sides of the coupler, e.g. between power amplifier and coupler and between coupler and antenna. In the case that the connection point is present between the coupler and the antenna, a fourth line, coming from the second power amplifier, will be present in the coupler.

Alternatively to the provision of a tunable capacitor, the coupler can be made suitable for various frequency domains by insertion of more than one resonant structure between the first and the second line. In this way the flat coupling as a function of frequency can be obtained over more than one frequency domain.

In another and/or further embodiment one or more layers of magnetic material are present in the coupler. Due to the presence of the layer of magnetic material, the inductive coupling between the resonant structure and the first and second lines is increased as the effective permeability of the medium—as constituted by the layers between and around the resonant structure and the lines—is enhanced. Since the inductance per unit length, and hence the amount of coupling, increases for the resonant structure, the inductor size can be reduced while the resonance frequency is maintained. As a result, the size of the coupler can be minimized. It is preferred to have two layers of magnetic material located at opposite sides of the resonant structure. Alternatively, or in addition, it can be present between the first and second lines. As a skilled person will understand, the layer of magnetic material can be located anywhere else in the coupler as well, such location being dependent on the specific design of the coupler. Suitable magnetic materials are known per se; preferred is a ferrite material, but most preferred is a layer of magnetic material which is present in a powdery form and is embedded in an insulating matrix material, for example, polymer or $SiO_2$. Such layers are commercially available. The advantage thereof is that such a layer can be applied as a liquid (by spincoating, printing or the like) and be integrated very well in a multilayer component.

It is a second object of the invention to provide an integrated electronic component of the kind mentioned in the opening paragraphs in which a coupler can be integrated.

This object is realized in that
  the electronic component is provided with the coupler according to any of the claims 2–7,
  the first and the second line, the inductor and the electrodes of the capacitor of the coupler are implemented in the electrically conductive layers of the electronic component, and
  the first and the second line and the resonant structure are mutually separated by at least one of the insulating layers of the electronic component.

Especially in the field of mobile communication, the number of individual components such as transistors, capacitors and inductors used steadily increases. At the same time, each of those components is minimized. Due to the high frequencies all interconnects act as inductors and potentially as parasitic capacitor electrodes. There is, therefore, a trend towards integrated electronic components which can be designed as a whole. These integrated electronic components may contain active elements. The passive elements are then located in the interconnect structure on top of the active elements, or next to the active elements in a substrate transfer process. Alternatively, the integrated electronic component comprises only or nearly only passive components and interconnects. Examples include a multilayer substrate, for example, ceramic or laminate, modules comprising a plurality of multilayer capacitors, and passive networks on a substrate, that are manufactured with techniques known from the manufacture of integrated circuits.

The thin-film embodiment of the coupler of the invention is very suitable for integration into the integrated electronic component, since it can be embodied with thin-film elements only. It is to be understood that the electrically conductive layers of the component include those at the surface. It is to be understood that the insulating layers of the electronic component may have a varying dielectric constant and effective permeability and may be optimized as desired. In case that a tunable capacitor is present, it is preferred that the component is any kind of passive network on a substrate. In the case that the component includes a layer of magnetic material, this layer could be integrated as a thin-film layer; however, it could be present as a discrete component on top of the electronic component as well.

An electronic device comprising a power amplifier and a power transmitter that are inter connected via a first line of a coupler that is further provided with a second line having a second output to a controlling circuit is known, for example, from EP641037. FIG. 7 of that document shows a block diagram of the application of a coupler. It shows the coupler with the first line between an amplifier and an antenna and with the second line between a grounded resistor electrode for absorbing electrical power and an automatic gain-control circuit. Using such a circuit, part of the output from the amplifier is transferred to the second output of the coupler and returns to the automatic gain-control circuit. Part of the high-frequency signal returning from the antenna is transferred to the grounded resistor electrode, e.g. the matched connection.

It is a disadvantage of the known electronic device that the coupler is fitted for a limited frequency domain only, and that hence an additional frequency compensator is necessary, implemented in the controlling circuit or at the coupler.

It is, therefore, a third object of the invention to provide an electronic device of the kind mentioned in the opening paragraphs with a more robust coupling. This object is realized in that the coupler according to any of the claims 1–7 is present. Due to the inclusion of the coupler of the invention, the electronic device is suitable for a larger frequency domain. The transmitter may be any transmitting component, but is preferably an antenna. The coupler may be present per se, but is preferably present as part of the integrated electronic component according to Claim 8. In a preferred embodiment, the electronic device comprises two power amplifiers and the coupler is present in the embodiment of the dual-band coupler.

The coupler may fulfill the coupling functions at various positions within the electronic device of the invention. A first application is that the coupler is used for the measurement and feedback of the outgoing signal from the power amplifier to the antenna. In this application, the controlling circuit is connected to the power amplifier. As the distance between the antenna and a base station is not constant, the strength of the outgoing signal must be large enough to reach the base station. However, there has been set a limit on the strength of the signal entering the base station by standardization. Besides, all energy must be supplied by a battery, so that any waste of energy due to malfunctioning of the coupler reduces the service life of the battery. For this application it is preferred that the coupler is present directly after the amplifier.

In a second application the coupler is used for measurement of the incoming signal. In this application the power amplifier is of the type known as a low-noise amplifier. The coupler is generally located before this low noise amplifier, e.g. at the line between the transmitter/receiver switch and the low-noise amplifier. The controlling circuit will control the low-noise amplifier in order that the incoming signal can be amplified as much as necessary.

In a further application the coupler fulfills the function of measurement of the reflected power of the antenna. This application is aimed at minimizing and preferably preventing any large signal of the power amplifier that is reflected at the antenna from reaching and breaking down the low-noise amplifier. It is especially important for wideband applications such as UMTS. The second output of the coupler is connected to a controlling circuit that adapts the impedance matching circuit in front of the antenna. In this application the coupler is located directly in front of the antenna The controlling circuit will tune an impedance matching network that is present between a transmitter/receiver switch and the antenna.

These and other aspects of the coupler, the integrated electronic component and the electronic device according to the invention will be described in detail with reference to the following figures, therein:

Figure 1:
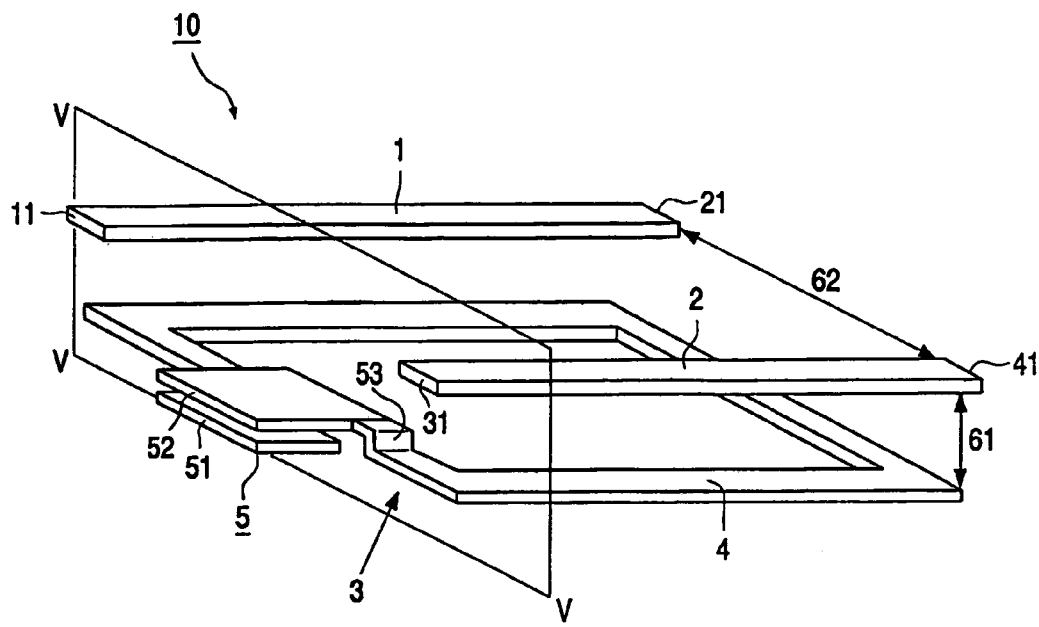
FIG. 1 shows a bird's eye perspective view of a first embodiment of the coupler.

FIG. 1 shows a bird's eye perspective view of a first embodiment of the coupler 10 of the invention. For the sake of clarity the substrate and the insulating layers have been omitted. The coupler 10 comprises a first line 1 connecting a signal input 11 to a signal output 21. It also comprises a second line 2 connecting a matched connection 41 to a second output 31. The matched connection 41 is connected to a grounded resistance of 50Ω. The second output 31 is connected to a controlling circuit. The first line 1 and the second line 2 are located at a mutual distance 62 of 660 µm. They are separated by an insulating layer of benzocyclobutene, having a relative dielectric constant of 2.6 and an effective permeability of about 1. The first line 1 has a length of 1.4 mm from the signal input 11 to the signal output 21. The first and the second line are embodied as copper tracks having a thickness of 5 µm and a width of 50 µm.

A resonant structure 3 is located substantially parallel to a plane made up by the first and the second line 1,2. The mutual distance 61 between the lines 1,2 and the resonant structure 3 is 8 µm. The resonant structure 3 comprises an inductor 4, having one turn, and a capacitor 5, provided with a first electrode 51 and a second electrode 52. The first electrode 51 is present in the same layer as the inductor 4. The second electrode 52 is connected to the inductor 4 with a via 53. The inductor 4 has a size of 1.0 mm×0.77 mm and an inductance of 2 nH. The capacitor has a capacitance of 7.4 pF. This results in a resonance frequency of 1.36 GHz. The first and second lines act as edge-coupled lines as will be evident to a skilled person.

Figure 2:
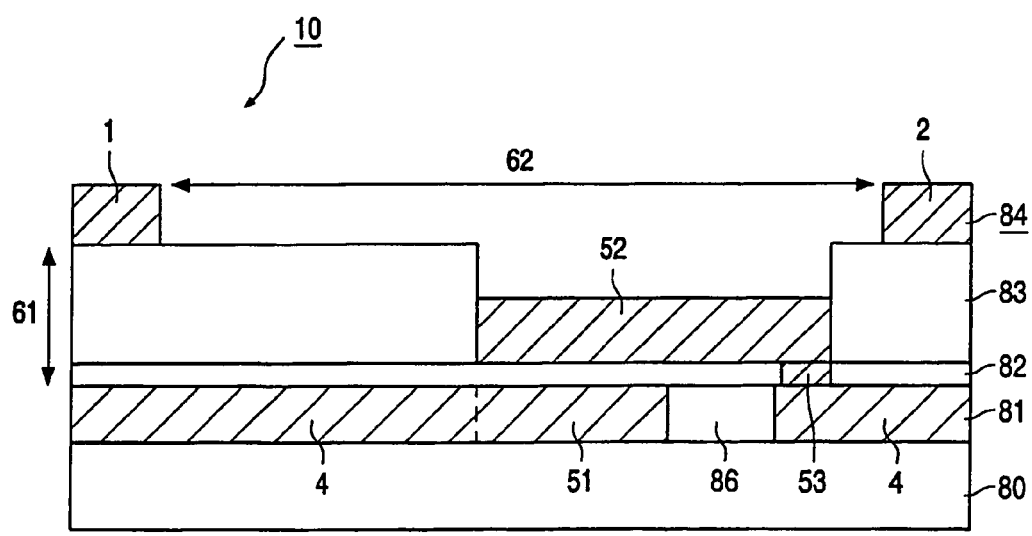
FIG. 2 shows a diagrammatical cross-section of the first embodiment of the coupler in the plane indicated as V—V in FIG. 1.

FIG. 2 shows a diagrammatical cross-section of the coupler 10, taken along the plane V—V as indicated in FIG. 1. The inductor 4 is part of a first electrically conductive layer 81 of Cu, having a thickness of 5 µm, that is present on a substrate 80. This layer is deposited by electroplating on a plating base comprising Au not shown. The first electrode 51 of the capacitor 5 is also part of the first electrically conductive layer 81. This layer is planarized with a planarization layer 86 that can be deposited either before or after the deposition of the first electrically conductive layer 81. On top of that a dielectric layer 82 is present. The dielectric layer 82 contains SiN in this example and has a relative dielectric constant of 6–7. It is structured according to a desired pattern in order to provide a connection between the inductor 4 and the second electrode 52 of the capacitor 5. Thereon, an insulating layer 83 is deposited. The insulating layer 83 comprises benzocyclobutene in this example, and has a relative dielectric constant of 2.6. Thereafter, a second electrically conductive layer 84 is deposited, comprising the first line 1, the second line 2 and the second capacitor electrode 52. This second electrically conductive layer 84 comprises Cu and is deposited by electroplating after (not shown) a barrier layer of TiN and a plating base of Cu have been applied by sputtering. The distance 62 between the first and the second line 1,2 is 660 µm and the distance between the lines 1,2 and the inductor 4 is 8 µm.

Figure 3:
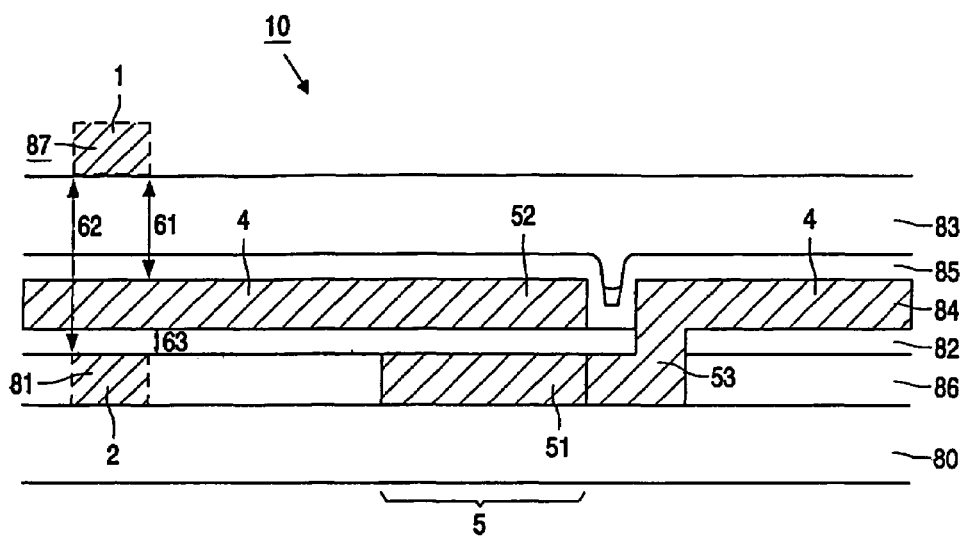
FIG. 3 shows a diagrammatical cross-section of a second embodiment of the coupler.

FIG. 3 shows a diagrammatical cross-section of a second embodiment of the coupler 10. In this embodiment the first line 1 and the second line 2 are present in different electrically conductive layers; for example, the second line 2 is present in a first electrically conductive layer 81. The first line 1 is present in a third electrically conductive layer 87. The inductor 4, to which both the first line 1 and the second line 2 are coupled, is present in a second electrically conductive layer 84. This second electrically conductive layer 84 is not placed symmetrically between the first and the third electrically conductive layers 81,87. The distance 61 between the first line 1 and the inductor 4 is different from the distance 63 between the second line 2 and the inductor 4. Moreover, the separating layers are different. Between the first and the second electrically conductive layer 81,84 only a dielectric layer 82 is present (this, however, could be different). A layer of magnetic material 85 and an insulating layer 83 are present between the second and the third electrically conductive layer 84,87. As a consequence, the amount of coupling between the first line 1 and the inductor 4 is different from the amount between the inductor 4 and the second line 2. The first electrically conductive layer 81 also comprises the first electrode 51 of the capacitor 5, while the second electrode 52 is present in the second electrically conductive layer 84. The first electrode 51 is connected to the inductor 4 through via 53. The first electrically conductive layer 81 is embedded in a planarizing layer 86.

In FIG. 3 the first and the second line 1,2 are shown in dashed lines. This is to show that the first and the second line 1,2 actually lie in a vertical plane other than the inductor 4. The location in a different vertical plane is envisaged to obtain adequate direct coupling between the first line 1 and the second line 2 which lie at a mutual distance 62.

Figure 4:
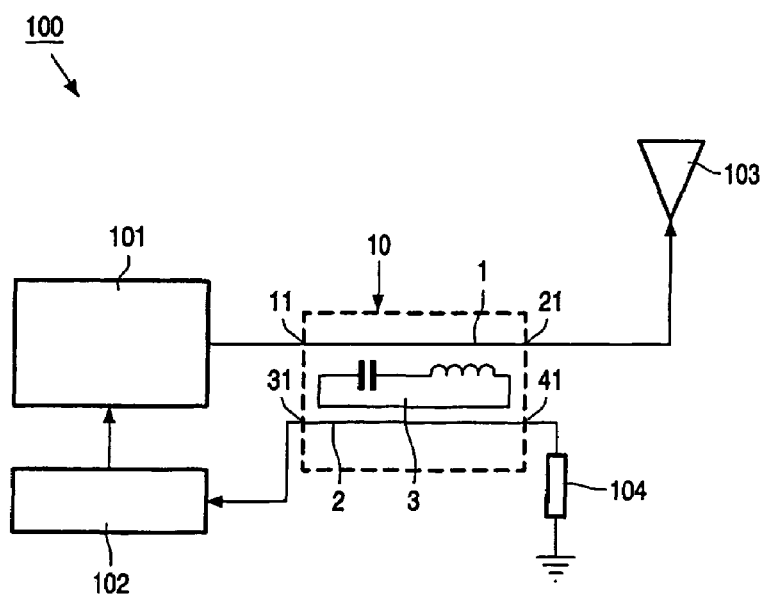
FIG. 4 shows an equivalent electrical diagram of a first embodiment of the electronic device.

FIG. 4 shows schematically an electrical representation of the electronic device 100 of the invention. The coupler 10 is present between a power amplifier 101 and a power transmitter 103 which is in this case an antenna. The coupler 10 comprises the first line 1 with signal input 11 and signal output 21 and the second line with matched connection 41 and second output 31. The matched connection is connected to a grounded resistance 104. The second output 31 is connected to a controlling circuit 102. On the basis of the signal S31, coming from the second output 31, the controlling circuit will regulate the output of the power amplifier 101. As a skilled person will understand, the controlling circuit 102 may be part of the power amplifier 101. The coupler 10 also comprises the resonant structure 3.

Figure 5:
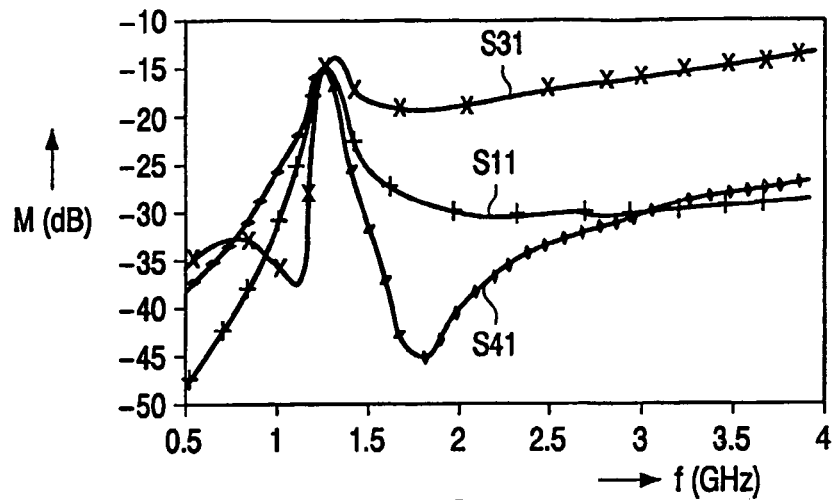
FIG. 5 shows the magnitude of the output signals of the first embodiment coupler as a function of the frequency.

FIG. 5 shows a graph in which the magnitude M of some signals is set out against the frequency f. The subject of this graph is the coupler 10 of the first embodiment as shown in the FIGS. 1 and 2 that has been optimized for a frequency of 1.8 GHz. In this graph, the line with crosses relates to S31, that is the signal at the second output 31 which is also known as the coupling. The line with the plus signs relates to S11, that is the outgoing signal at the signal input 11, which is also known as the return loss or reflection. The line with the blocks relates to S41, that is the outgoing signal at the matched connection 41, which is also known as the isolation. It follows from FIG. 5 that the resonance frequency is 1.3 GHz and that all signals S11, S31 and S41 have the same magnitude. Surprisingly, the signals split up at frequencies just above this resonant frequency. The coupling S31 has a magnitude of about −18 dB and with increasing frequency increases linearly to −15 dB at 4 GHz. The return loss S11 diminishes towards −30 dB at 4 GHz. The isolation S41 diminishes to −45 dB at 1.8 GHz, and subsequently increases to −30 dB at 4 GHz. As a consequence, a difference of about 15 dB between the signal S31 and the signals S11 and S41 is maintained until 4 GHz. This difference is also known as the directivity. It is even about 25 dB around 1.8 GHz, which is considered to be important. It is observed that in the present example the resonant structure does not play an important role at frequencies higher than 2.5 GHz. However, if the resonant structure is designed to have a higher resonance frequency, that is aspect assumed to be different.

Figure 6:
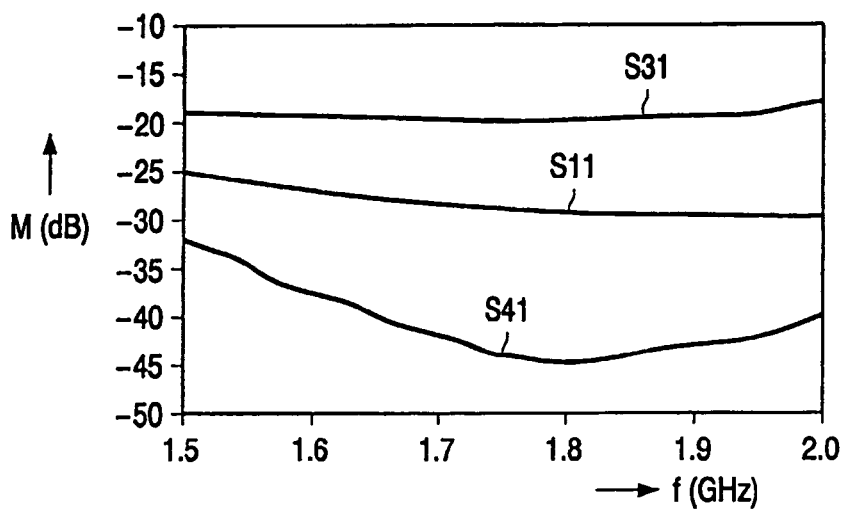
FIG. 6 shows an enlargement of a detail of FIG. 5.

FIG. 6 shows an enlargement of the graph of FIG. 5 in the frequency domain between 1.5 and 1.8 GHz. As can be seen, the magnitude of the signal S31 is nearly constant. The advantage of this is fact that no compensation for the frequency variation of the coupling S31 within one frequency domain used as a band for communication need be implemented in the control circuit.

Figure 7:
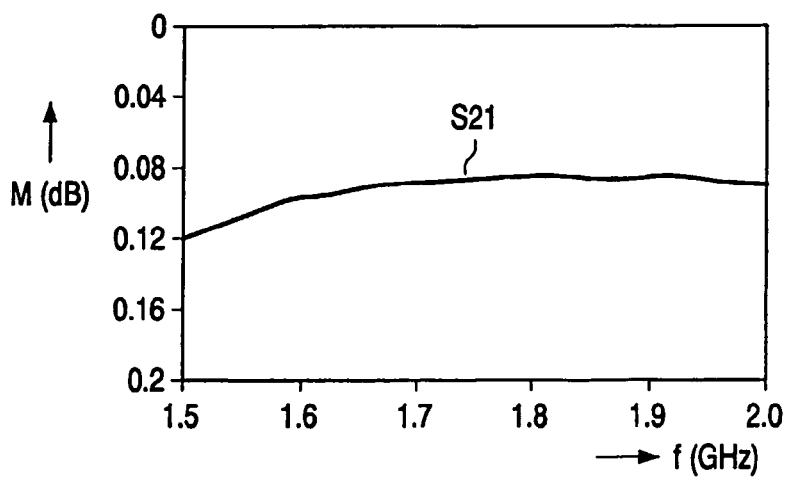
FIG. 7 shows the insertion loss of the first embodiment of the coupler as a function of the frequency.

FIG. 7 shows another graph in which the magnitude M of a signal is set out against the frequency f. The subject of this graph is again the coupler 10 of the first embodiment. This graph shows the signal S21 at the signal output 21 which is also known as the insertion loss. In the domain between 1.5 and 2 GHz this insertion loss is between −0.12 and −0.08 dB, and hence very small.

Figure 8:
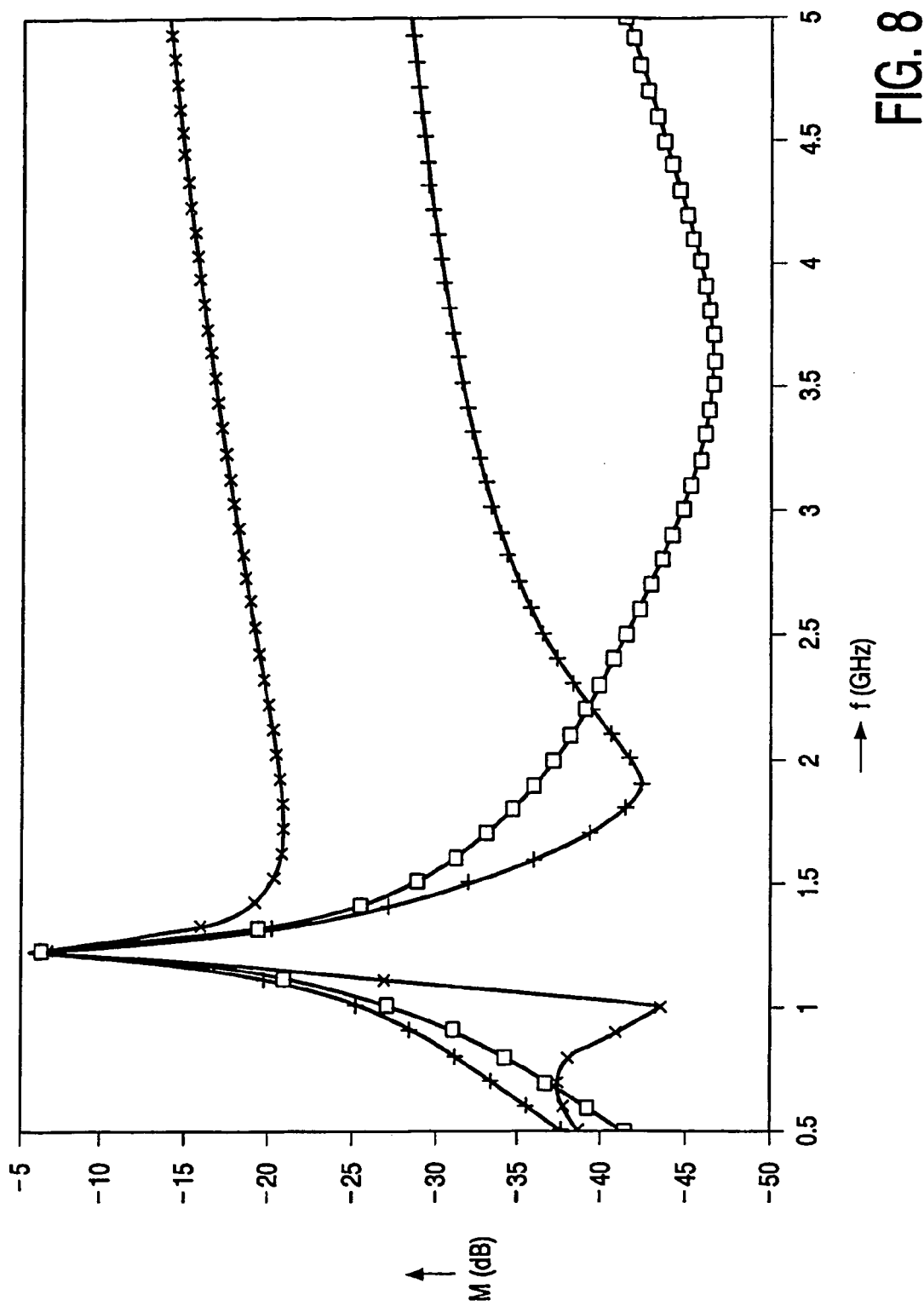
FIG. 8 shows the magnitude of the output signals of a modified version of the first embodiment of the coupler as a function of the frequency.

FIG. 8 shows a graph in which the magnitude M of a signal is set out against the frequency f and which relates to a somewhat different version of the first embodiment. In this version the inductor is provided with one turn and the resonance frequency is 1.36 GHz. The bird eye's view and the cross-section are as shown in the FIGS. 1 and 2. The size of the inductor 4 is 1.4×0.84 mm, the capacitor 5 has a size of 0.56 mm², thus resulting in a resonance frequency of 1.36 GHz. In this graph, the line with crosses relates to S31 which that is the signal at the second output 31, which is also known as the coupling. The line with the plus signs relates to the S11, that is the outgoing signal at the signal input 11, which is also known as the return loss or reflection. The line with the blocks relates to S41, that is the outgoing signal at the matched connection 41, which is also known as the isolation. It follows from that FIG. 8 that all signals S11, S31 and S41 have the same magnitude at the resonance frequency. Just above this resonant frequency the signals split up. The coupling S31 has a magnitude of about −21 dB at 1.7 GHz and with increasing frequency increases linearly to −14 dB at 5 GHz. The return loss S11 diminishes towards −42 dB at 1.8 GHz and subsequently increases to −29 dB. The isolation S41 diminishes to −46 dB at 3.6 GHz, and increases thereafter.

Figure 9:
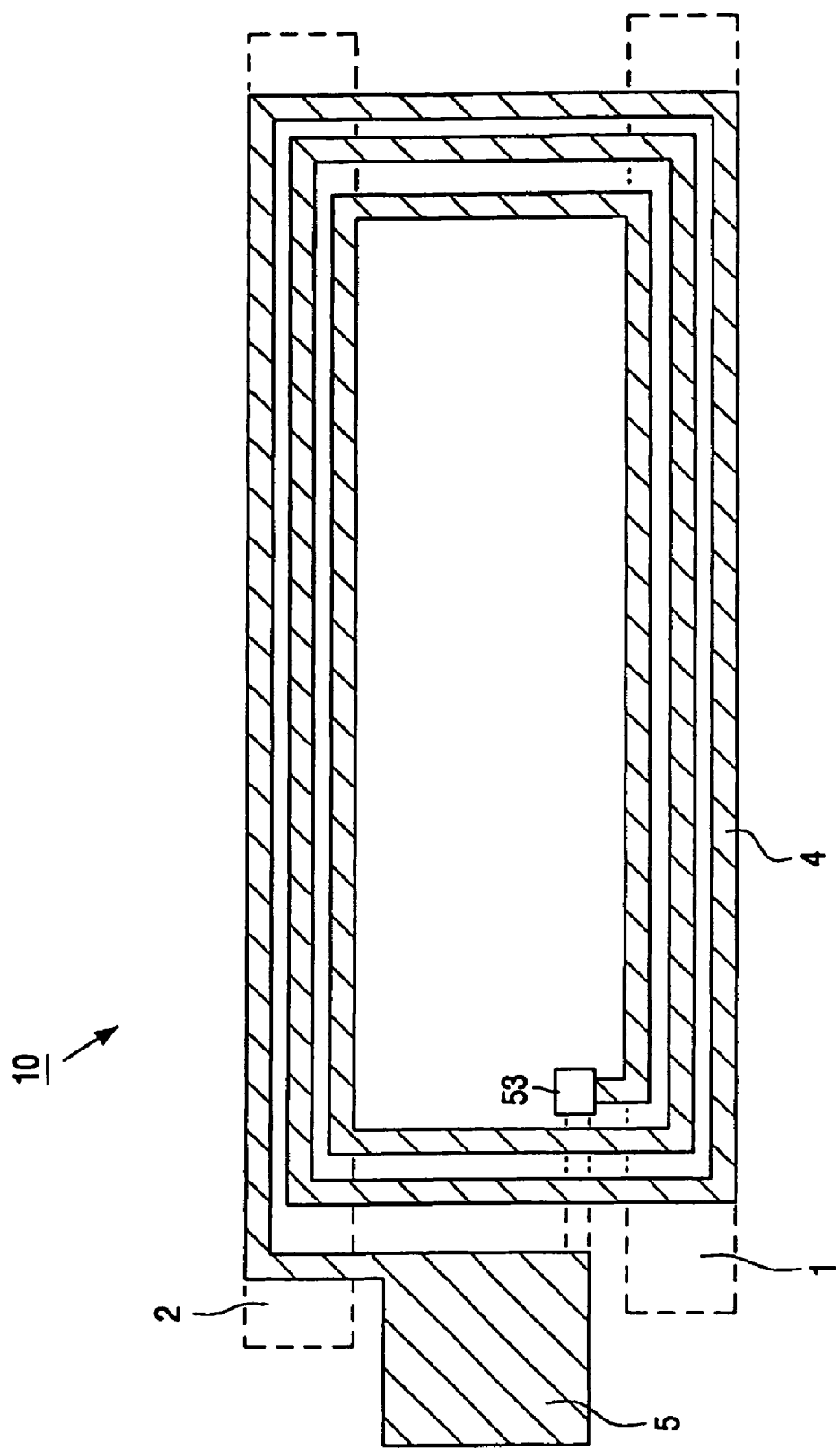
FIG. 9 shows a diagrammatical top view of a third embodiment of the coupler.

FIG. 9 shows a diagrammatical top-view of a third embodiment of the coupler 10 according to the invention. This embodiment has been realized in a technology with a first and a second electrically conductive layer which are separated by an insulating layer of benzocyclobutene and a dielectric layer of silicon nitride. A cross-section of this embodiment is substantially equal to the cross section shown in FIG. 2. The coupler 10 comprises a first line 1, a second line 2 and a resonant structure, having a capacitor 5 and an inductor 4. In this third embodiment, the inductor 4 has three turns, so that the surface area of the coupler 10 is reduced by one third as compared to the version of the first embodiment shown in FIG. 8. It has a length of 1.5 mm and a width of 0.6 mm. The width of the inductor turns is 30 µm, and their spacing is 20 µm. The first and the second line 1,2 have a width of 130 µm. The first and the second electrode 51,52 of the capacitor 5 have a size of 240×250 µm.

Figure 10:
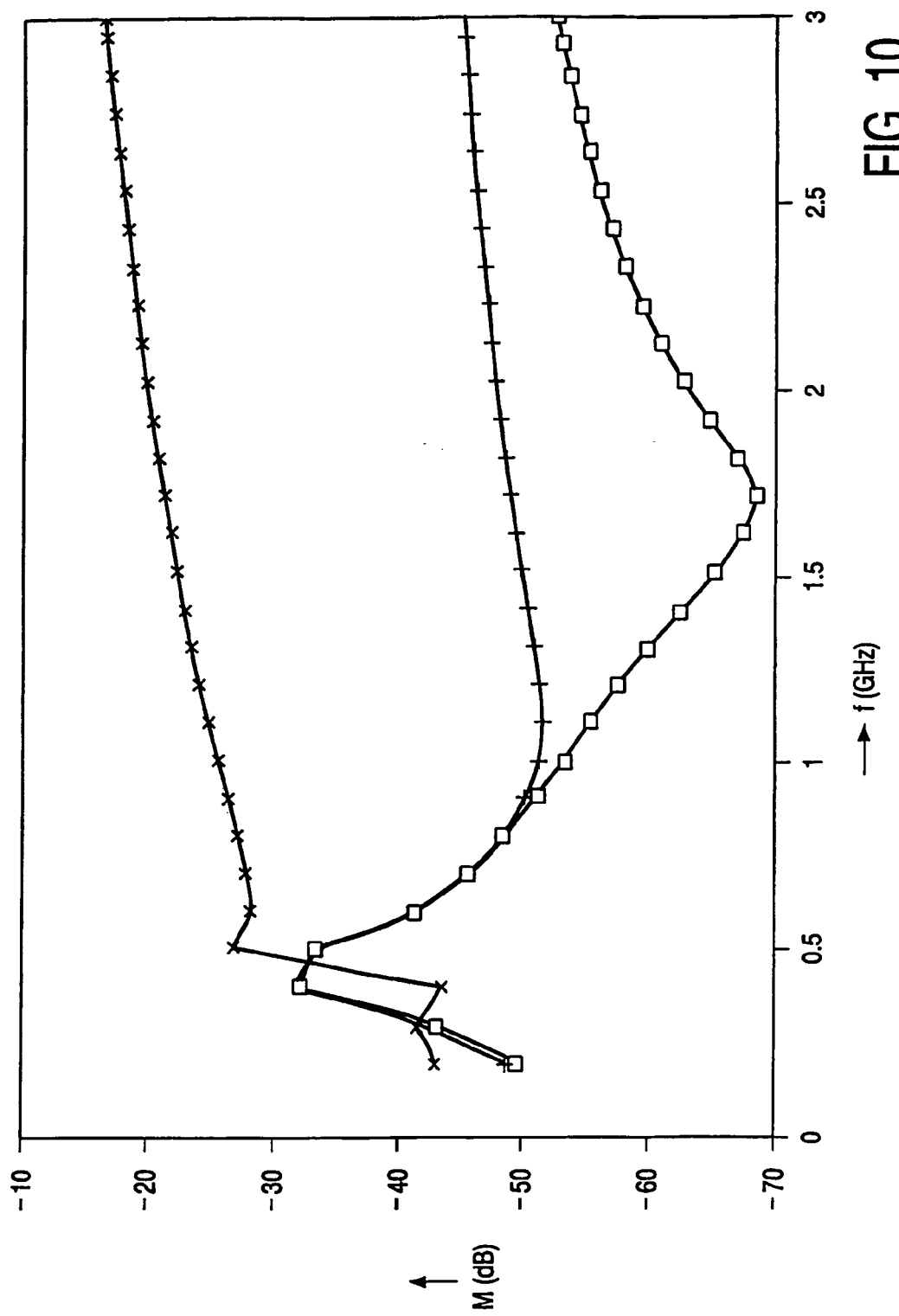
FIG. 10 shows the magnitude of the output signals of the third embodiment of the coupler as a function of the frequency.

FIG. 10 is a graph in which the magnitude M of some signals is set out against the frequency f. In this graph the symbols refer to the same signals as in FIG. 5 and FIG. 8: the line with blocks denotes S41, the line with plus signs denotes S11 and the line with crosses denotes S31. As can be seen in FIG. 10, the increase of the coupling S31 as a function of the frequency is less steep as the frequency increases. For frequencies around 1.8 GHz, which is in use as the DCS-band, and for frequencies around 2.4 GHz, which is in use as the Bluetooth-band, the coupling S31 is therefore reasonably constant. Moreover, the isolation S41 and the return loss S11 are very low, e.g. −50 dB or less, thus providing a good directivity.

Figure 11:
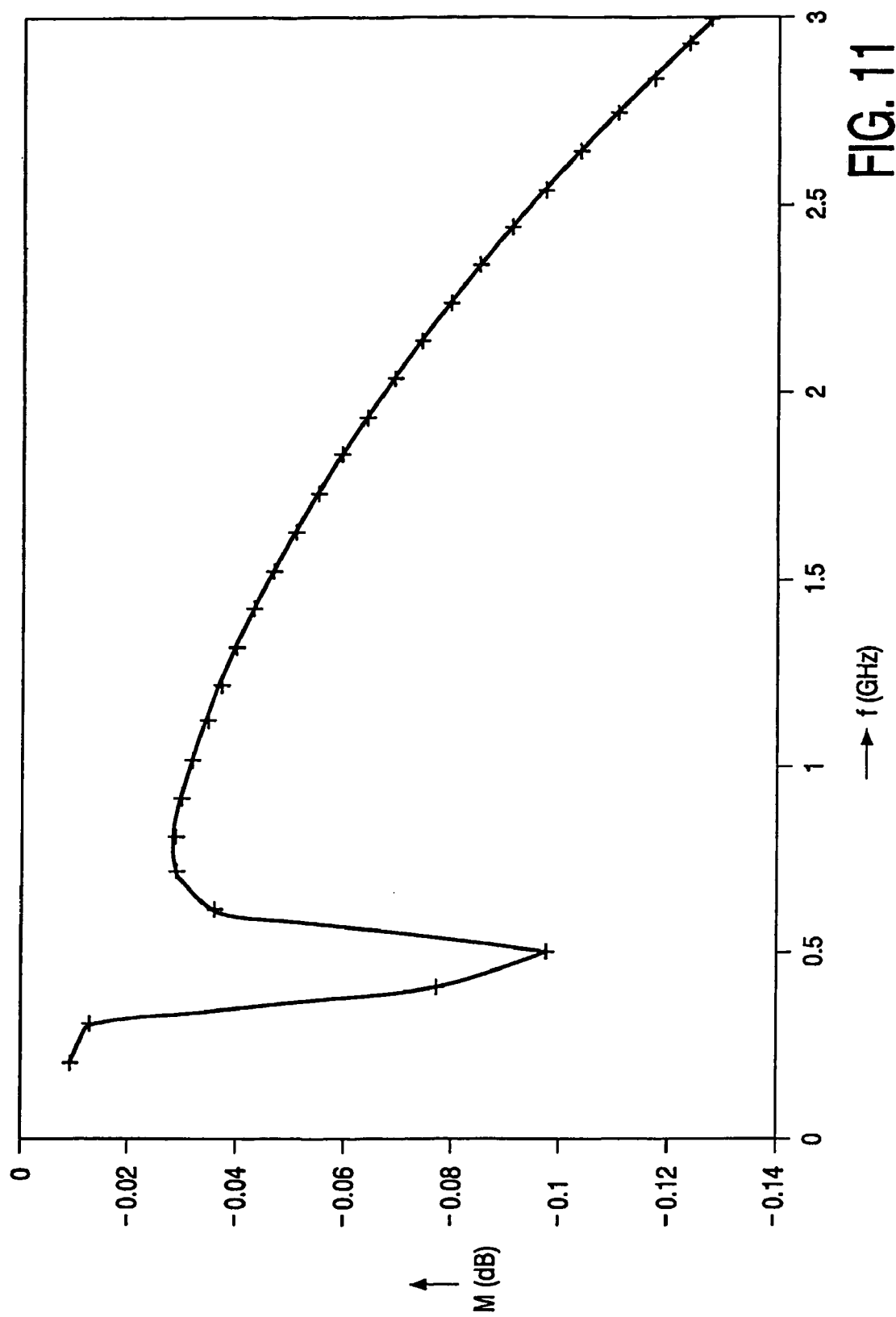
FIG. 11 shows the insertion loss of the third embodiment of the coupler as a function of the frequency.

FIG. 11 is another graph in which the magnitude M of a signal is set out against the frequency f. The subject of this graph is again the coupler 10 of the third embodiment. This graph shows the signal S21 at the signal output 21 which is also known as the insertion loss. This insertion loss is in the range between 0 and −0.1 dB in the domain of frequencies lower than 2.5 GHz, and hence is very small.

Figure 12:
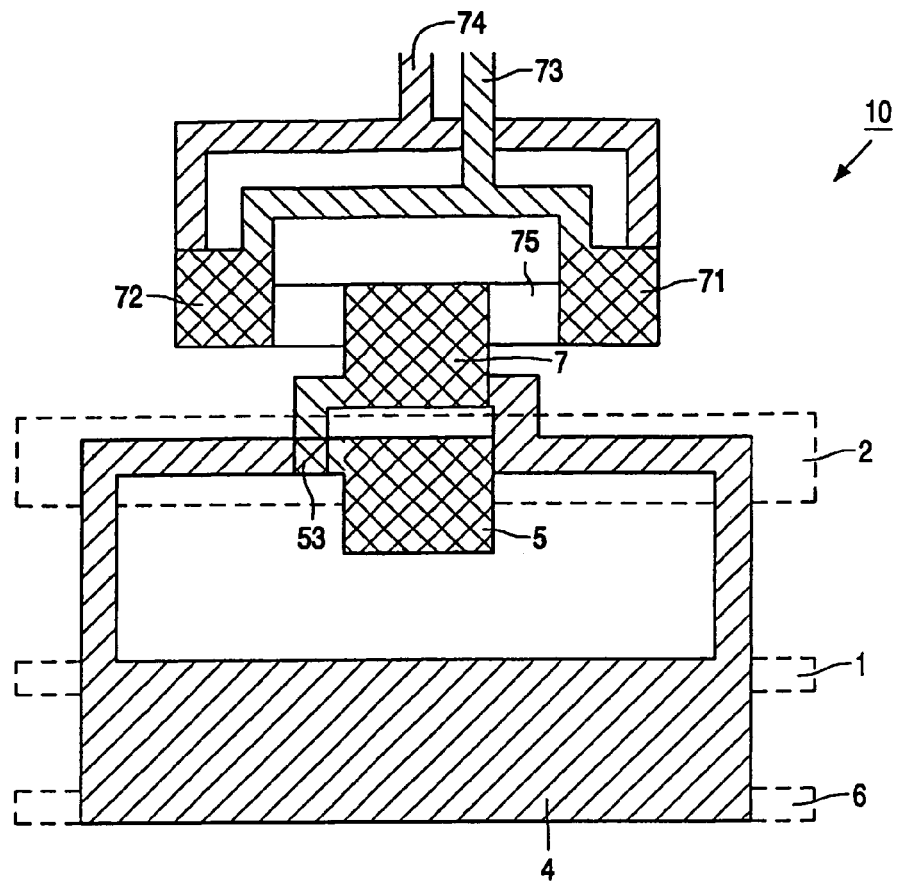
FIG. 12 shows a diagrammatical top view of a fourth embodiment of the coupler.

FIG. 12 shows a diagrammatical top view of a fourth embodiment of the coupler 10 according to the invention. In this embodiment the coupler 10 comprises, in addition to the capacitor 5, a tunable capacitor 7. This tunable capacitor 7 is embodied as a micro-electromechanical switching (MEMS) capacitor. Furthermore, not only a first line 1 and a second line 2 are present, but also a third line 6. In this embodiment the resonance frequency of the resonant structure can be set during the operation of the coupler 10. This allows the use of a single coupler 10 for the coupling of signals of various frequencies related to one antenna, for example signals of the DCS band of about 1.8 GHz and signals of the Bluetooth band of about 2.4 GHz. Due to the presence of the third line 6, the output of the coupler can be provided to different controlling circuits, each adapted to a specific amplifier. It will be understood that an alternative solution is the provision of the switch inside the controlling circuit.

The tunable capacitor 7 is in fact a capacitor with a first and a second electrode that are separated by a dielectric comprising a layer of dielectric material, in this case $Si_3N_4$, with a thickness of 0.425 µm and 1 µm air. On top of the second electrode a bridge 75 is provided, which bridge mechanically connects the tunable capacitors to actuation capacitors 71, 72. These actuation capacitors 71,72 have a size of half the tunable capacitor 7 and contain air as the dielectric. One of the electrodes of each actuation capacitor is connected to ground, e.g. via interconnect 74, whereas a DC voltage can be applied to the other electrode. If a DC voltage is provided of 10–20 V, the electrodes of the actuation capacitors 71,72 will attract each other. As a consequence of the presence of the bridge 75, the second electrode of the tunable capacitor 7 will be pushed downwards towards the first electrode. A larger capacity is thus provided, and the resonance frequency is lowered. The capacity of the tunable capacitor 7 can be tuned in the range of from about 8 to 150 pF/mm². In this embodiment, the tunable capacitor 7 is present parallel to the capacitor 5. Therefore, the capacitor 5 determines the upper resonance frequency, and the resonance frequency can be lowered by closing the tunable capacitor 7. It will be understood by a skilled person in the art of tunable capacitors, that the DC voltage to be applied is dependent on the specific construction of the capacitors. Furthermore, a MEMS switch and a standard capacitor could be provided instead of the MEMS-capacitor, thus resulting in a dual-band coupler.

In the embodiment of this FIG. 12 the first, second and third lines 1,2,6 are provided in a first electrically conducting layer that is covered with a layer of insulating material such as $SiO_2$. Alternatively, this first electrically conducting layer can be present in a multilayer substrate. The first, second and third lines 1,2,6 are edge-coupled lines. The first line 1 is situated in the middle to provide sufficient direct coupling to both the second line 2 and the third line 6. In order to provide sufficient coupling between the first line 1 and the resonant structure 3, the inductor 4 is embodied with a broader turn. Alternatively, the inductor can be provided with multiple turns. The inductor 4 and the first electrodes of the capacitors 5,7,71, 72 are provided in a second electrically conducting layer. On top of this a layer of dielectric material, in this case $Si_3N_4$, is provided. This layer is patterned in a conventional way such that it is present in the capacitors 5,7 but not in the capacitors 71,72. Subsequently, a sacrificial layer is provided according to a desired pattern. This pattern is such that at the capacitor 5 the sacrificial layer is absent. Subsequently, a third electrically conducting layer is applied in a desired pattern. This pattern comprises the second electrodes of the capacitors 5,7, 71,72. Finally, the sacrificial layer is removed to obtain the tunable capacitor 7 and the actuation capacitors 71,72.

Figure 13:
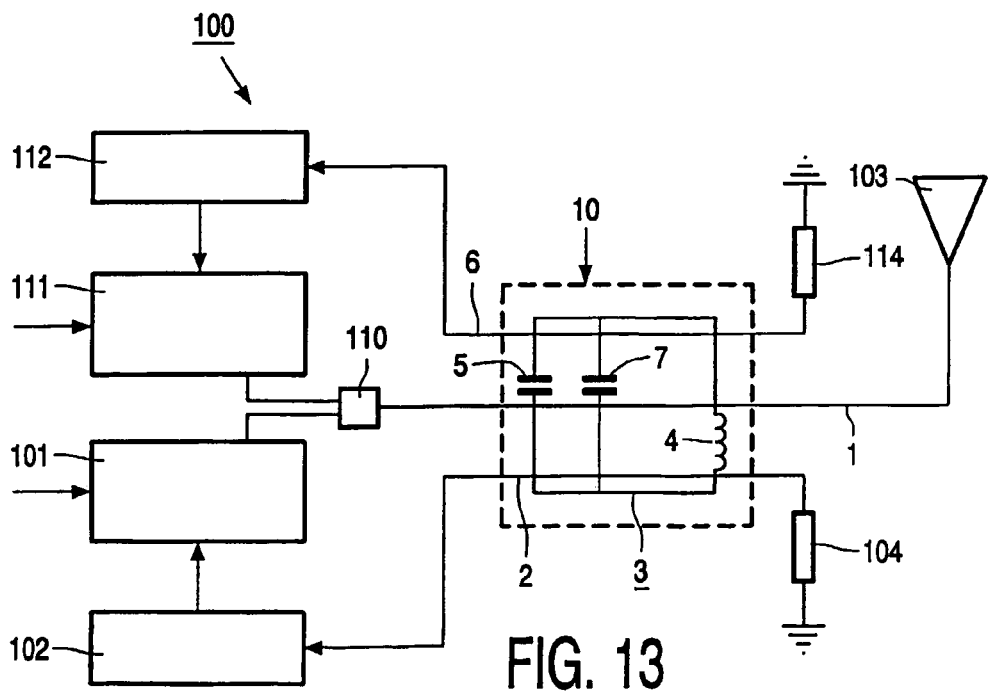
FIG. 13 shows an equivalent electrical diagram of a second embodiment of the electronic device comprising the fourth embodiment of the coupler.

FIG. 13 shows schematically an electrical representation of a second embodiment of the electronic device 100 of the invention. This embodiment includes the coupler 10 as shown in FIG. 12. The coupler 10 is present between a power amplifier switch 110 and a power transmitter 103, which is in this case an antenna. The coupler 10 comprises a first, a second and a third line 1,2,6 and the resonant structure 3 with the inductor 4, the capacitor 5 and the tunable capacitor 7. The first line 1 connects the amplifier switch 110 and the antenna 103. The second line 2 and the third line 6 are each present between a grounded resistor 104, 114 and a controlling circuit 102, 112. The controlling circuit 102 will provide feedback to the power amplifier 101. The second controlling circuit 112 will provide feedback to the power amplifier 111.

Concluding the invention provides the coupler having a first line and a second line further comprises a resonant structure including a capacitor and an inductor. Therewith, the coupler delivers a coupling signal S31 that is substantially frequency independent over a frequency domain above the resonance frequency of the resonant structure. Also, the signal S31 has a large directivity. The coupler can be present as part of an integrated electronic component, such as a multilayer substrate, a thin-film module or an IC. It can be applied in an electronic device between a power amplifier and an antenna. Therewith the coupling signal S31 will be provided to a controlling circuit.

The invention claimed is:

1. A coupler (10) comprising a first line (1) connecting a signal input (11) to a signal output (21), and a second line (2) connecting a matched connection (41) to a second output (31), which first and second line (1,2) are mutually coupled inductively and capacitively, characterized in that:
   a resonant structure (3) is provided; and
   the first line (1) and the second line (2) are coupled inductively and capacitively to the resonant structure (3), the resonant structure (3) comprises a thin-film capacitor (5) and a thin-film inductor (4), and the first and the second line (1,2) are coupled inductively and capacitively to the inductor (4).

2. An integrated electronic component for use at frequencies of 100 MHz and higher and fulfilling filtering and/or switching functions and comprising a substrate (80) and a plurality of electrically insulating (83, 86) and electrically conductive layers (81,84,87), characterized in that
   the electronic component is provided with the coupler (10) according to claim 1,
   the first and the second line (1,2), the inductor (4) and the electrodes (51,52) of the capacitor (5) of the coupler (10) are implemented in the electrically conductive layers (81,84,87) of the electronic component, and
   the first and the second line (1,2) and the resonant structure (3) are separated by at least one of the insulating layers (83) of the electronic component.

3. A coupler (10) as claimed in claim 1, characterized in that the inductor (4) of the resonant structure (3) has one turn that is present in a first electrically conductive layer (81), and the first and the second line (1,2) are present in a second electrically conductive layer (84).

4. A coupler (10) as claimed in claim 3, characterized in that
   the capacitor (5) comprises a first and a second electrode (51,52), which first electrode (51) is present in the first electrically conductive layer (81) and which second electrode (52) is present in the second electrically conductive layer (84), and
   the first and the second electrically conductive layer (81, 84) are separated by a spacer comprising a dielectric layer (82) and an insulating layer (83), the insulating layer (83) being absent between the first and second electrode (51,52) of the capacitor (5).

5. A coupler (10) as claimed in claim 1, characterized in that the capacitor (5) is a tunable capacitor.

6. A coupler (10) as claimed in claim 5, characterized in that a third line (6) is present, which third line (6) connects a matched connection to a third output and is coupled inductively and capacitively to the first line (1) and is coupled inductively and capacitively to the resonant structure (3).

7. A coupler (10) as claimed in claim 1, characterized in that a layer of magnetic material (85) is present.

8. An electronic device (100) comprising a power amplifier (101) and a power transmitter (103) that are inter connected via a first line (1) of a coupler (10) that is also provided with a second line (2) having a second output (31) to a controlling circuit (102), characterized in that the coupler (10) is provided according to claim 1.

9. The use of the electronic device (100) according to claim 8 at a frequency of at least 0.1 GHz.

10. An electronic device (100) as claimed in claim 8, characterized in that
    a second power amplifier (101), a second controlling circuit (102) and the coupler according to claim 6 (10) are present, and
    the third output of the third line (6) of the coupler (10) is connected to the second controlling circuit (102) whereby the output of the second power amplifier (101) can be controlled.

11. An electronic device as claimed in claim 8, characterized in that the coupler (10) is provided as part of an integrated electronic.

* * * * *